United States Patent [19]

Fukuda et al.

[11] 4,448,801
[45] May 15, 1984

[54] PROCESS FOR FORMING DEPOSITION FILM

[75] Inventors: Tadaji Fukuda, Kawasaki; Yuji Nishigaki, Tokyo, both of Japan

[73] Assignee: Canon Kabushiki Kaisha, Tokyo, Japan

[21] Appl. No.: 487,718

[22] Filed: Apr. 29, 1983

Related U.S. Application Data

[63] Continuation of Ser. No. 275,586, Jun. 18, 1981.

[30] Foreign Application Priority Data

Jun. 23, 1980 [JP] Japan .................................. 55-85019

[51] Int. Cl.$^3$ .......................................... H01L 45/00
[52] U.S. Cl. ................................... 427/39; 427/53.1;
427/54.1; 427/55; 427/36; 427/86; 427/87; 427/74
[58] Field of Search ....................... 427/39, 53.1, 54.1, 427/55, 36, 74, 86, 87

[56] References Cited

U.S. PATENT DOCUMENTS

| | | | |
|---|---|---|---|
| 4,217,374 | 8/1980 | Ovshinsky | 427/39 |
| 4,226,643 | 10/1980 | Carlson | 427/39 |
| 4,226,897 | 10/1980 | Coleman | 427/39 |

FOREIGN PATENT DOCUMENTS 20134 12/1980 European Pat. Off. ............. 427/86

OTHER PUBLICATIONS

Taniguchi et al., "Amorphous Silicon Hydrogen Alloys Produced under Magnetic Field", Journal of Non-Crystalline Solids, 34 & 36, (Jan.–Feb. 1980), pp. 189–194.

*Primary Examiner*—John D. Smith
*Attorney, Agent, or Firm*—Fitzpatrick, Cella, Harper & Scinto

[57] ABSTRACT

This invention is a process for forming film of amorphous material on a support. The amorphous material comprises at least either of hydrogen atom or halogen atom and at least either of silicon atom or germanium atom as a matrix. The film is formed by utilizing a discharge of direct current or low frequency alternating current and, particularly, is radiated with an electromagnetic wave which sensitizes the said amorphous material.

3 Claims, 5 Drawing Figures

PROCESS FOR FORMING DEPOSITION FILM

This application is a continuation of application Ser. No. 275,586 filed June 18, 1981.

BACKGROUND OF THE INVENTION

1. Field of the Invention

The present invention is concerned with an improved process for forming a deposition film by means of DC or low frequency AC discharge, and more particularly it relates to a process for forming a deposition film which improves the forming speed extraordinarily.

2. Description of the Prior Art

Amorphous material which comprises at least one of silicon or germanium atom as a matrix and contains at least one of hydrogen or halogen atom (identified as X), such as amorphous hydrogenated silicon (hereinafter represented by "a-Si:H") amorphous halogenated silicon (hereinafter represented by "a-Si:X"), amorphous hydrogenated germanium (hereinafter represented by "a-Ge:H"), amorphous halogenated germanium (hereinafter represented by "a-Ge:X") and the like, have many advantages as shown below.

(1) Since the above mentioned amorphous material has less defects (dangling bonds, voids and the like) than conventional amorphous silicon (hereinafter represented by "a-Si") or amorphous germanium (hereinafter represented by "a-Ge"), it exhibits high sensitivity when used as a photoconductor.

(2) By doping an amorphous material with the elements of Group III of the Periodic Table such as boron (B), and elements of Group V such as phosphorous (P), arsenic (As), and the like, in the same manner as in case of crystalline silicon (hereinafter represented by "C-Si") or crystalline germanium (hereinafter represented by "C-Ge"), the type of conductivity may be controlled in either of p-type, n-type or i-type.

(3) Since a vacuum discharge deposition, such as a glow discharge deposition, may be utilized in forming a film having a large surface, the amorphous material is useful for producing an element for solar cell, as target material for an image-pickup tube, and as photoconductive material for an electrophotographic photosensitive member. On the contrary, a deposition speed in forming films such as films of a-Si:H, a-Si:X, a-Ge:H, a-Ge:X and the like according to the above mentioned process, is generally 0.1 to 40Å/sec, which is very slow as compared with that of a photoconductive material, such as Se. This slow speed results in low productivity to hamper a cost efficient operation, and causes a great hindrance when a-Si:H, a-Si:X, a-Ge:H, a-Ge:X and the like are used for the purpose of forming the thick film. Particularly, when these materials, a-Si:H, a-Si:X, or a-Ge:H, a-Ge:X, are used as a photoconductive material and are formed in a layer of photoconductive material of an electric photographic photosensitive member, generally employed in the procedure of electrophotography, a photoconductive layer is required to be 10 $\mu$m or more in thickness to produce a good image, and thereby, the slow speed of depositing a film on the substrate becomes a more serious problem in practical application.

For instance, on forming a 20 $\mu$m thickness of a photoconductive layer of a-Si:H series, or a-Si:X series material, it takes almost 5.5 hours to form a photoconductive layer under a deposition speed of 10 Å/sec. Accordingly it requires a long time to form a deposition layer, and the electrophotographic photosensitive member becomes expensive. Consequently, in the case of the glow discharge process which is believed to have high reproducibility and to give a highly sensitive film in forming a film of a-Si:H, a-Si:X, a-Ge:H or a-Ge:X, various approaches concerning improvements in deposition apparatus and deposition speed related to a discharge power; concentration, pressure and flow rate of the raw material gas; frequency of discharge source and a temperature of substrate, have been studied for increasing the deposition speed. As for "a-Si:H", for example, it is disclosed in the paper "Characterization of Plasma-Deposited Amorphous Si:H" by Knight, that by increasing concentration of the material gas and discharge power, the deposition speed increases from 1 Å/sec. to 9 Å/sec.

It is also disclosed in the paper "large surface area amorphous Si solar cell" by Yoshiyuki Uchida that a deposition speed is increased to 3 Å/sec. from 1 Å/sec. by changing the pressure of the raw material gas in the range between 2 and 20 Torr, and that increase in deposition speed takes place by improving the design of an inlet port for introducing the raw material gas, an outlet port of exhaust gas, and a discharge electrode. However, at present, it has never been reported that a practical photosensitive film of a-Si:H, a-Si:X, a-Ge:H, a-Ge:X and the like, having a thickness of several tens $\mu$m can be deposited within several hours, that is, a process for forming a film continuously during a specified film forming time at a deposition speed of several tens Å/sec. has never been reported.

Thus, development a process of forming film in a thickness of several tens $\mu$m while maintaining a high deposition speed, has been approached in various fields of arts. However, no excellent forming process for depositing such a film effective for industrial application has ever been proposed.

On the other hand, in the forming process for films of a-Si:H, a-Si:X or a-Ge:H, a-Ge:X by vacuum deposition there are known generally capacitive type and inductive type processes. Among these, when a film of a large surface area having uniform properties is desired, a capacitive type process is generally preferred, and, particularly, application of a capacitive glow discharge is more effective.

The capacitive type process is further classified into a direct current method and an alternating current method.

When a film is formed on the support by decomposing a raw gaseous material to be used for forming film such as, for example, SiH$_4$, Si$_2$H$_6$ and the like, and by depositing an amorphous material and which comprises silicon atom as matrix, in the alternating current method, the frequency of electric power for generating glow discharge is usually from several MHz to several tens of MHz.

The reason for using such a high frequency is that, since films of, for example, a-Si:H and a-Si:X possess a volume resistance of when high as about $10^7$-$10^{15}$ ohm.cm, as being deposited on a substrate or on a discharge electrode being used as a substrate, a stable discharge may be maintained for many hours by preventing an increase in discharge impedance which takes place due when a similar effect to introducing in series a material having relative small capacitance within a discharging zone.

Thus, the alternating current process is advantageous since a stable continuous discharge can be maintained while it is disadvantageous in that the deposition speed is, in general, so slow that it takes a long time to form a thick film.

On the other hand, it is understood that a direct current discharge is highly desirable where a raw gaseous material is effectively decomposed and only the necessary components, among the resultant compounds deposit on the support at a high speed. However, as disclosed above, impedance increases as the deposition proceeds, and it becomes difficult to maintain a stable discharge for many hours.

These effects may be explained in accordance with the accompanying drawings. In FIG. 1, discharge electrodes 2 and 3 face each other at a distance of about 50 mm and the discharge electrode 2 holds a substrate 4 of aluminum, which may be heated with a heater 7 built in a film deposition apparatus 1. The apparatus 1 is exhausted towards the direction of arrow mark B by a vacuum pump to a pressure of $2 \times 10^{-6}$ torr. Then an inlet valve 6 is opened to let a raw gaseous material such as $Si_2H_6$, $SiH_4$ and the like into a film deposition apparatus 1, from a direction mark "A" in a flow rate of 50 SCCM. The vacuum pump is controlled to adjust the pressure in film deposition apparatus 1 to 1 torr, and direct current voltage is applied to the discharge electrodes 2 and 3 from direct current power 5 to cause a discharge for forming film.

In FIG. 2, the relation between time of film deposition and discharge current and deposition rate at a discharge voltage of 600 V is represented graphically. As shown in FIG. 2 it is clear that when a glow discharge is utilized, discharge current and deposition rate are decreased suddenly as the deposition proceeds, and finally the discharge ceases spontaneously and the deposition can not be further maintained. For example, in the case of a-Si:H film, the glow discharge will be able to form film thickness of at most several microns.

SUMMARY OF THE INVENTION

It is an object of the present invention to provide a process for forming a deposition film of amorphous material such as a-Si:H, a-Si:X or a-Ge:H, a-Ge:X, which comprises at least one of hydrogen atom or halogen atom (X) and at least one of germanium atom or silicon atom as a matrix under the conditions that a thick film is formed at a high speed of deposition while maintaining conditions needed for obtaining a practical photosensitivity.

It is another object of the present invention to provide a process for forming a deposition film, which can obtain a film having uniform properties throughout its surface area.

According to the present invention there is provided a process for forming a film of amorphous material on a support which amorphous material comprises at least one of hydrogen atom or halogen atom and at least one of silicon atom or germanium atom as a matrix, which process utilizes discharge of direct current or low frequency alternating current and characterized in that the formed film is irradiated with an electromagnetic wave capable of activating the amorphous material.

DETAILED DESCRIPTION OF PREFERRED EMBODIMENTS

Figure 1:
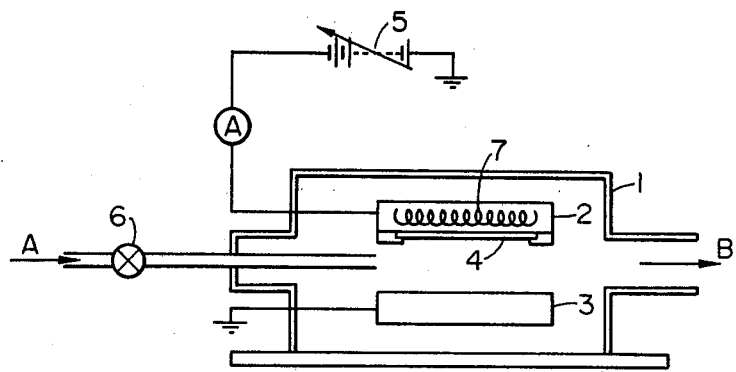
FIG. 1 is a typical schematic drawing of an apparatus for which a prior art process is illustrated.
Figure 2:
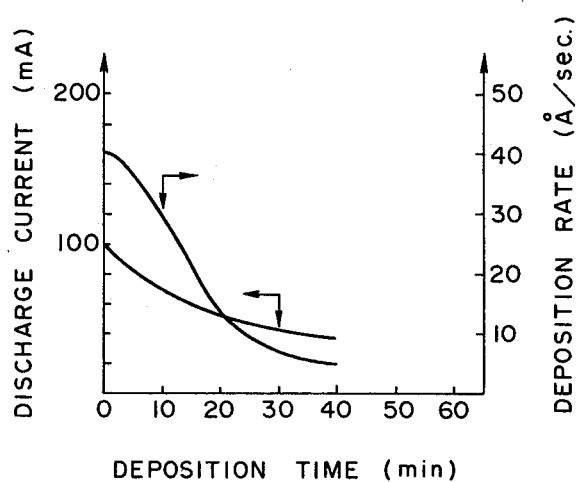
FIG. 2 graphically shows examples of test results which are conducted with the prior known apparatus of FIG. 1.

In the process for forming a deposition film of the present invention wherein a film of amorphous material which comprises at least one of hydrogen atom or halogen atom and at least one of silicon atom or germanium atom as a matrix, is formed on a support, utilizing with a direct current or low frequency alternating current, an electromagnetic wave capable of activating the amorphous material which is applied to the surface of the formed film.

As the electromagnetic wave to irradiate the films according to the present invention, most types of waves may be applied such that its irradiated film increases the conductivity and the characteristics of the film are not deteriorated by the irradiation.

Such electromagnetic waves may be ultra-violet rays, visible rays, infrared rays, X-ray, γ-ray and the like.

Among these, ultra-violet rays, visible rays and infrared rays are preferably applied often in view of their safety in the forming film process ease of application for electromagnetic wave irradiating apparatus; excellent efficiency for irradiation and the like.

It is found that those electromagnetic waves having a larger energy than the energy band gap Eg of amorphous material to be formed and having a wave spectra which is absorbed not only on the film surface but also in the interior thereof to some extent, are the most preferable ones.

The electromagnetic waves having the above mentioned characteristics are, for example, visible rays having a wave range within the range of 350 nm to 850 nm in wave length, preferably 500 nm to 800 nm, provided that the film is composed of a-Si:H and a-Si:X.

The irradiation process employing the electromagnetic waves in forming a film may be performed continuously throughout the process, or intermittently depending on the film forming speed.

An applicable discharge according to the present invention may be glow discharge or arc discharge with direct or low frequency alternating current, and, particularly, a glow discharge with a direct current is more desirable due to the resulting superior effects.

A low frequency alternating current of several Hzs to several tens of Hzs, which is proximate to a direct current, is effective, and particularly, a glow discharge which is generated with an alternating current of several Hzs to form a film is also effectively used.

In the present invention, in order to obtain better results, heating the substrate to a specific temperature, in cooperation with irradiating with an electromagnetic wave, is also desirable. The temperature (Ts) of the substrate which is heated, is generally at 50° C. or higher, preferably 100° C. to 450° C.

In summary according to the present invention if a film of amorphous material is formed on the substrate under the conditions of irradiating the top or bottom surface of the film together with applying direct current or low frequency alternating current, the film can be continuously formed at high speed for a long time.

Further, the film can be obtained under the conditions at which a discharge potential and the discharge current are maintained at almost constant values.

In other words, since the discharge energy is maintained at an almost constant, value it is possible to produce a film which contains a uniform concentration of hydrogen atom or/and halogen atom (X) throughout a large surface area and which possesses uniform properties.

In order to explain the distinctive efficiency of the present invention, an amorphous material comprising silicon as a matrix is further illustrated as an example. It is understood that other amorphous materials which comprise germanium atom or silicon and germanium atoms also exhibit the same result.

The following illustrative examples illustrate the most effective embodiments of the present invention under the condition that capacitive type direct current glow discharge is utilized.

EXAMPLE 1

Figure 3:
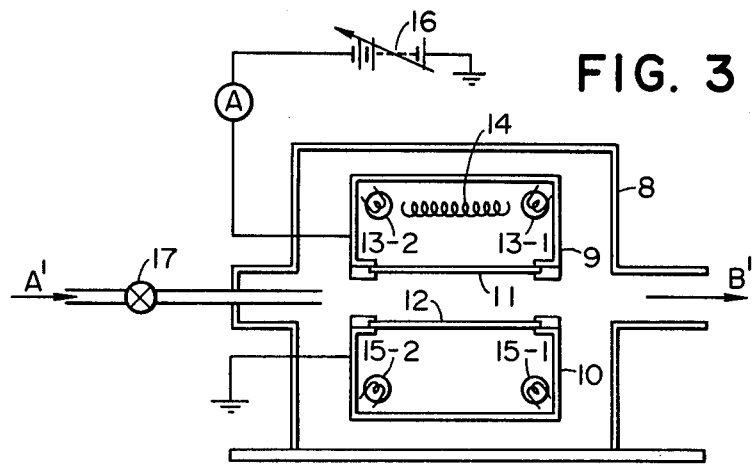
FIGS. 3 and 5 are typical schematic drawings of apparatus to realize the present invention, respectively.

In a film deposition apparatus 8 shown on a FIG. 3, discharge electrode holders 9 and 10 were disposed facing each other at a distance of 50 mm.

The discharge electrode holder 9 involved halogen lamps 13-1 and 13-2, and heater 14 for the substrate, and held a substrate 11 of glass which was covered with a transparent electrode of ITO [$In_2O_3(Sn)$] at a opening part of the holder, so that the electrode might be faced downwards.

The discharge electrode holder 10 was constituted in the same manner as in the holder 9 except that the electrode was faced upwards.

The discharge electrode holder 9 and substrate 11 of glass were electrically connected, and the former was connected to a negative terminal of direct current power 16. The discharge electrode holder 10 and substrate 12 of glass were also electrically connected and the discharge electrode holder 10 was grounded.

The film deposition apparatus 8 was exhausted in the direction of an arrow mark B with a vacuum pump until a pressure of $2 \times 10^{-6}$ torr was obtained. After switching on a substrate heater 14, a substrate 11 of glass was heated to 200° C. and maintained. When the vacuum pressure reached $2 \times 10^{-6}$ torr and the substrate temperature reached 200° C., inlet valve 17 for introducing raw gas was opened, and $SiH_4$ gas was introduced at the flow rate of 50 SCCM into film deposition apparatus 8. A vacuum pump was controlled so that the pressure of the apparatus 11 was maintained at 1 torr. Then, a power of minus 600 volts was charged onto a substrate holder 9 by switching on a direct current source 16 to generate glow discharge as well as lighting on lamps 13 and 15 to form film of a-Si:H on the substrate of glass which is covered with ITO.

A discharge current of 100 mA was maintained constantly during the deposition process. The relations between deposition time and discharge current, and between deposition time and deposition speed on forming the film, are shown respectively on FIG. 4 with solid lines.

After 2 hours of deposition, a-Si:H film of about 28 μm was formed on the substrate 11 of glass covered with ITO.

Figure 4:
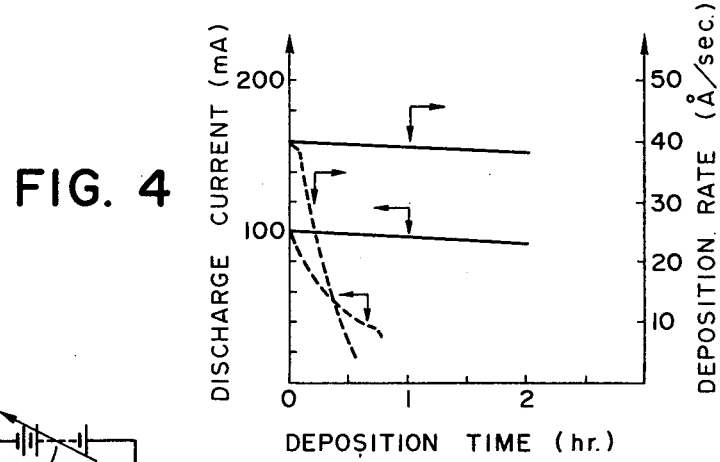
FIG. 4 graphically shows the results of deposition according to the present invention as compared with the results of a prior art process.

In FIG. 4, results of a comparison test which was conducted under the same conditions except without switching on halogen lamps 13-1, 13-2, 15-1 and 15-2, was shown with dotted lines.

EXAMPLE 2

Figure 5:
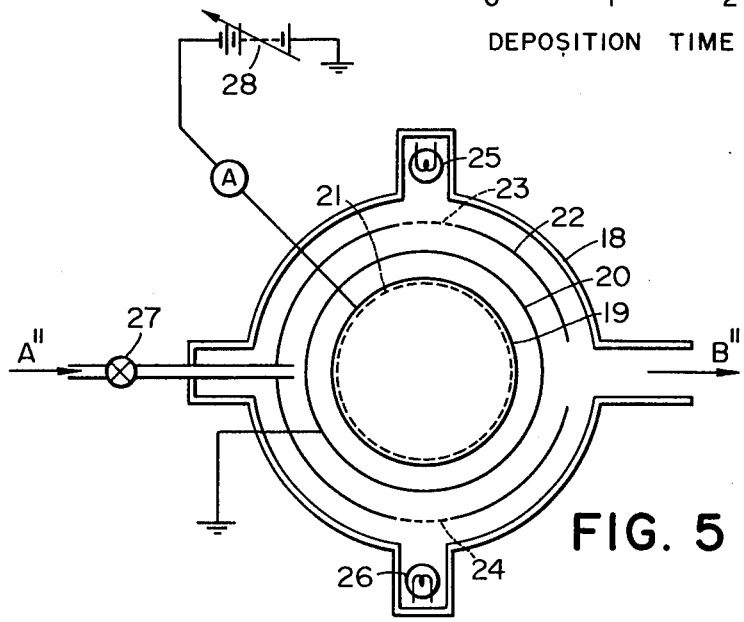

FIG. 5 illustrates a cross sectional view of film deposition apparatus 18 which was used in this example. In the film deposition apparatus 18, discharge electrodes 19 and 20 which faced each other at a distance of 50 mm were constituted as in Example 1, and the discharge electrode 19 which was supported on an Al substrate 21 had a function due to possession of electroconductive properties. And further, the discharge electrode 19 involved a heater (not shown on the Figure) for heating Al substrate 21. A statical electric shielding cylinder 22 was disposed in order to limit a discharge region outside of the discharge electrode 20.

Two individual pieces of metallic mesh 23 and 24 were disposed in the said statical electric shielding cylinder 22, so that a light might penetrate through the cylinder.

Halogen lamps 25, 26 were placed correspondingly each outside part of the metal mesh 23 and 24 for radiating the surface of deposited film on discharge electrodes 19 and 20.

The film deposition apparatus 18 above was utilized for 2 hours for depositing film on the Al substrate under the same conditions as of Example 1 to obtain a film having excellent properties in 30 μm thickness which showed good results.

What we claim is:

1. A process for forming a film of an amorphous material comprising at least one member selected from the group consisting of hydrogen atom and halogen atom and at least one member selected from the group consisting of silicon atom and germanium atom as a matrix, which comprises introducing a film formable material in a gaseous form containing at least a source of silicon or germanium as a matrix-formable atom into a vacuum deposition chamber, and decomposing the gaseous material by discharge of direct current or low frequency alternating current while supplying to the film during formation at least one member selected from hydrogen and halogen characterized in that the film, during formation, is irradiated with an electromagnetic wave having a wavelength from 350 nm. to 850 nm to activate the amorphous material and increase electroconductivity of the film.

2. The process of claim 1 further characterized in that the support is heated.

3. The process of claim 1 further characterized in that the support is heated to 100°–450° C.

* * * * *